United States Patent
Lindkvist

(10) Patent No.: US 6,698,005 B2
(45) Date of Patent: Feb. 24, 2004

(54) MIN-TIME / RACE MARGINS IN DIGITAL CIRCUITS

(75) Inventor: Hans Lindkvist, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 10/076,434

(22) Filed: Feb. 19, 2002

(65) Prior Publication Data

US 2003/0159118 A1 Aug. 21, 2003

(51) Int. Cl.[7] .............................................. G06F 17/50
(52) U.S. Cl. ................... 716/6; 716/4; 716/5
(58) Field of Search ................... 716/4–6, 16; 703/19, 703/23

(56) References Cited

U.S. PATENT DOCUMENTS

| | | | |
|---|---|---|---|
| 5,218,551 A | * 6/1993 | Agrawal et al. | 716/10 |
| 5,259,006 A | 11/1993 | Price et al. | |
| 5,452,239 A | * 9/1995 | Dai et al. | 703/19 |
| 5,475,830 A | * 12/1995 | Chen et al. | 716/6 |
| 5,659,484 A | * 8/1997 | Bennett et al. | 716/16 |
| 5,659,716 A | * 8/1997 | Selvidge et al. | 703/23 |
| 5,740,067 A | 4/1998 | Hathaway | |
| 5,764,528 A | * 6/1998 | Nakamura | 716/6 |
| 5,903,471 A | 5/1999 | Pullela et al. | |
| 6,321,366 B1 | * 11/2001 | Tseng et al. | 716/6 |

OTHER PUBLICATIONS

Yao–Wen Chang; Wong, D.F.; Zhua, K.; Wong, C.K.; "On a new timing–driven routing tree problem FPGA", Circuits and Systems, 1996. ISCAS '96., 'Connecting the World'., 1996, IEEE International Symposium on , Volum:: 4, May 12–15, 1996 Page(s): 420–423.*

Ebeling et al.: "On the performance of level–clocked circuits", Proceedings, Sixteenth Conference on Advanced Research in VLSI, p. 342–356, ISBN 0–8186–7047–9. (Abstract).

Hsieh et al.: "Concurrent timing optimization of latch–based digital systems", Proceedings, International Conference on Computer Design: VLSI in Computers and Processors, p. 680–5, ISBN 0–8186–7165–3.

Lee, T. et al.: "Timing Optimization Algorithm for Design of High Performance VLSI Systems", 1996 IEEE International Symposium on Circuits and Systems (ISCAS). Circuits and Systems Connecting the World. Atlanta, May 12–15, 1996, IEEE International Symposium on Circuits and Systems (ISCAS), New York, IEEE, US, vol. 4, May 12, 1996, pp. 465–468, XP000704637 ISBN: 0–7803–3074–9.

* cited by examiner

Primary Examiner—Vuthe Siek
Assistant Examiner—Naum Levin
(74) Attorney, Agent, or Firm—Burns, Doane, Swecker & Mathis, L.L.P.

(57) ABSTRACT

A preferred timing change is automatically selected from a set of candidate timing changes that can be made to address a short path violation in a circuit design. This involves determining an associated cost metric for each of the candidate timing changes, and identifying a lowest cost metric from the associated cost metrics. The candidate timing change associated with the lowest cost metric is selected from the set of candidate timing changes, for use as the preferred timing change. The associated cost metric may represent a cost per resolved source or destination register. Candidate timing changes may variously involve any of a number of techniques for introducing additional delays into a short path of the circuit.

58 Claims, 7 Drawing Sheets

MIN-TIME / RACE MARGINS IN DIGITAL CIRCUITS

BACKGROUND

The invention relates to clock circuits in electronic devices, and more particularly to methods and apparatuses for automatically determining a preferred technique for resolving short path violations or adding robustness in clock distribution systems.

The precise timing of events in synchronous digital circuits is supervised and synchronized by so-called clock signals. The task of the clock signals is to reduce the uncertainty in delay between sending and receiving storage elements. Storage elements, such as latches and flip-flops, respond to a predefined characteristic of a clock signal (e.g., a leading or trailing edge of the clock signal) by sampling output signals supplied by combinational logic or other storage elements. The sampled value is internally preserved by the storage element as the state of the circuit. The state of the storage element is made available for new computations after a certain delay.

As the overall design of a digital circuit becomes more complex, it is increasingly important to design a clock distribution system with care. As a clock signal traverses different branches of a tree-like distribution network, its critical component (e.g., a leading clock edge) may arrive at different storage elements at different times. This timing difference between clock arrival times at different points in the digital circuit is called clock skew.

Clock skew can be quantified in any of a number of different ways. When only two registers are considered, a local skew can be defined as the time difference between the clocking of the sending register and the clocking of the receiving register. This skew takes on a negative value if the receiving register is clocked later than the sending register, and takes on a positive value if the receiving register is clocked earlier than the sending register. Alternatively, clock skew can be defined as the magnitude of the difference between the clocking of the sending register and the clocking of the receiving register. In this case, clock skew is always stated as a positive value.

When more than two registers are considered, the term clock skew can be defined as the difference between the longest propagation path through the clock network and the shortest, and is thus always a positive value.

Clock skew may cause data-processing errors if it becomes excessive. This is because a storage element, responding to an early-arriving clock signal (excessive positive clock skew), may attempt to sample the output of one portion of the digital circuit before that output has settled into a valid state. This so-called "long path violation" limits the maximum clock frequency that may be applied to the circuit.

Alternatively, a storage element receiving an excessively delayed clock signal (excessive negative clock skew) may attempt to sample the output of one portion of the digital circuit at a point in time when what was a valid signal has already begun to transition into a different state. The term "short path violation" is used throughout this disclosure to refer to this type of timing violation problem, in recognition of the fact that the problem can be viewed as arising because one circuit path is effectively too short (i.e., it does not introduce a sufficient amount of delay to compensate for the late-arriving clock at the destination register).

To avoid these problems, current schemes for distributing clock signals to storage elements concentrate on ensuring a high degree of synchronism between all clock signals, in what are termed balanced clocking or zero-skew clocking strategies. Clocks are typically distributed in a tree-like structure, which permits delays in different branches to be balanced to a high degree. A benefit of this approach is that the clock rate can be high, because it is not limited by the variation in clock arrival times. Even when lower clock rates are involved, the uniformity provided by these strategies brings predictability and therefore simplifies the overall design problem.

Even with highly balanced clock-trees, between groups of storage elements with separate clock-trees and within blocks having very large clock-trees, the clock skew may still be large enough to violate setup and hold constraints on storage elements or even cause race conditions. For short path violations, this is traditionally solved by extending the data paths causing the problems: individual or several cascaded inverters or buffers are added, which add delay in the data path.

Another approach has been to add a storage element that is responsive to an opposite clock edge between problematic or potentially problematic groups of storage elements. In general, this added storage element need not be an edge triggered element; for example, it may be a level-sensitive latch. The basic function of the added element is to send and receive an opposite clock edge between groups with large or potentially large skew between them. This is, for instance, used in tools that put in scan-chains in synchronous designs, for handling skew in the chains. In this context, the devices are called lockup-latches (or lockup-flip-flops). Where it has been desired to add these elements only where they are needed, this operation has so far had to be performed manually. With respect to test mode paths, some automated design tools insert these added elements based merely on the possibility of clock skew, without taking the actual timing into consideration. As a result, many latches are inserted into test mode paths without actually being needed. Such an approach imposes a needless waste of resources on the design.

In contrast to highly balanced clock-trees, a different methodology exists that combines clock timing with data path timing. Timing analysis produces permissible ranges, which impose a set of constraints on clock delays to individual registers or other storage devices. Then, the permissible ranges are explored to increase safety margins on timing, improve clock frequencies, and optimize the clock design. The method, called useful-skew clock skew scheduling, needs sufficient slack on local skew to be efficient.

The dominating method of resolving short path violations or adding robustness by adding cascaded buffers becomes more expensive than an added latch at about the point when three buffers are added (approximately 1 ns in 0.25 micrometers CMOS), but no technique has so far been used for automatically choosing between adding cascaded buffers and adding a latch, except with respect to scan chains, but here only on scan paths.

SUMMARY

It should be emphasized that the terms "comprises" and "comprising", when used in this specification, are taken to specify the presence of stated features, integers, steps or components; but the use of these terms does not preclude the presence or edition of one or more other features, integers, steps, components or groups thereof.

In accordance with one aspect of the present invention, the foregoing and other objects are achieved in methods and apparatuses that automatically select a preferred timing change from a set of candidate timing changes that can be made to address a timing problem in a circuit design. This involves determining an associated cost metric for each of the candidate timing changes. In some embodiments, a lowest cost metric is identified from the associated cost metrics. The candidate timing change associated with the lowest cost metric is then selected from the set of candidate timing changes for use as the preferred timing change.

In some embodiments, the associated cost metric represents a cost per resolved source or destination register.

In alternative embodiments, a total cost is determined for each of the candidate timing changes. Then, after performing the cost analysis for each timing violation to be resolved, a set of candidate timing changes is selected that together resolve all of the timing violations at the lowest combined cost.

BRIEF DESCRIPTION OF THE DRAWINGS

The objects and advantages of the invention will be understood by reading the following detailed description in conjunction with the drawings in which.

DETAILED DESCRIPTION

Figure 1:
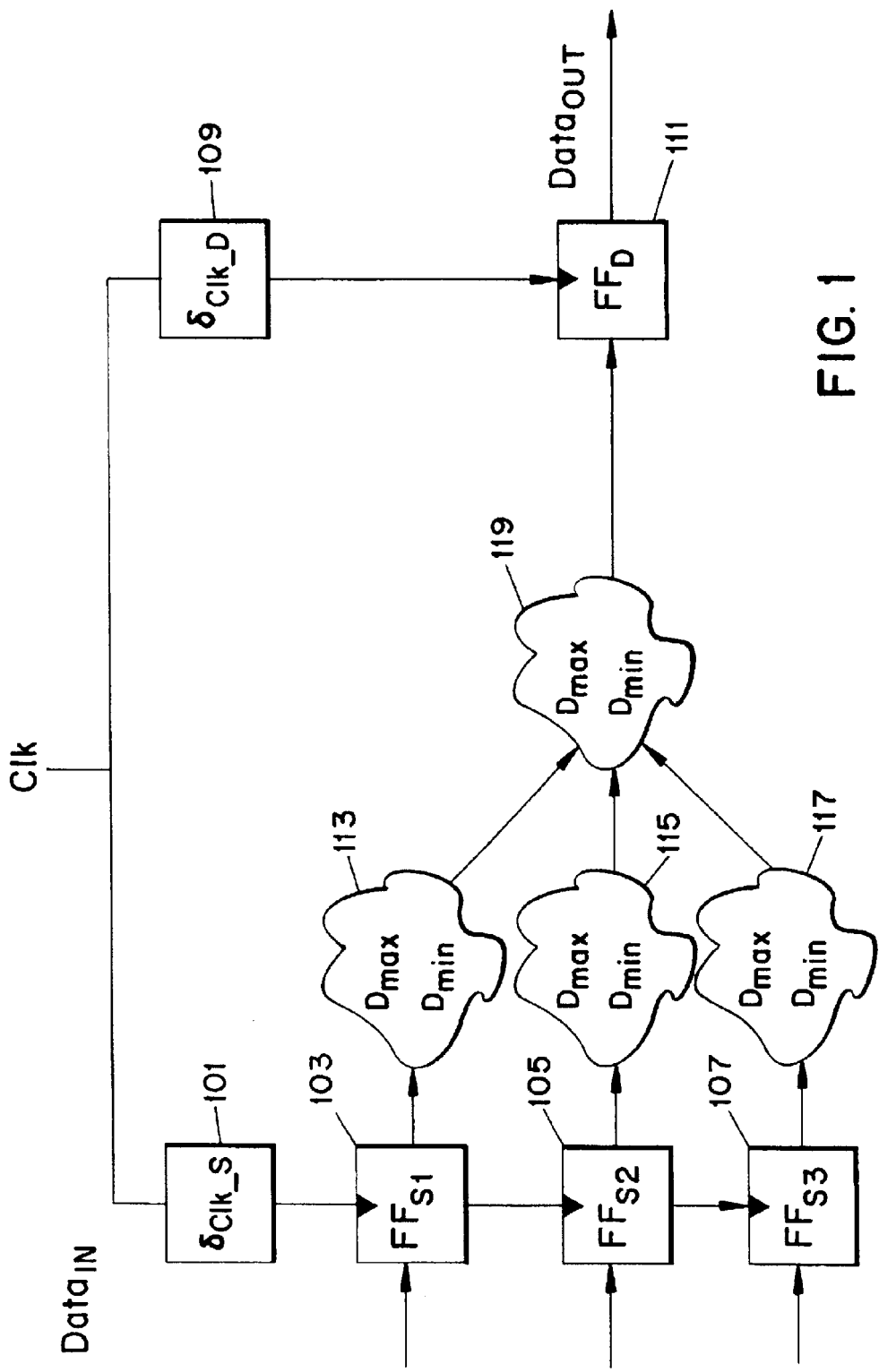
FIG. 1 is a block diagram of an exemplary circuit having a timing problem.

The various features of the invention will now be described with reference to the figures, in which like parts are identified with the same reference characters.

The invention provides methods and apparatuses for automatically determining the type of device or devices that should be inserted into a circuit (as well as the insertion points) in order to resolve short path violations of varying magnitude and/or to reduce a circuit's sensitivity to negative skew. In accordance with one aspect of the invention, this is achieved by determining an associated cost value for each of a number of candidate changes to a circuit that are each designed to resolve a particular short path violation or reduce the circuit's sensitivity to negative skew. In a preferred embodiment, each cost value represents a cost per register that is benefitted by the change. The generated cost values are then compared with one another, and the candidate change associated with the minimum cost value is the one selected for implementation.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination above moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

The following terminology and notations are used within this disclosure:

Leading-edge: The clock edge at which sending and receiving edge triggered devices update (typically rising edge).

Trailing edge: The clock edge following the leading-edge (typically falling edge).

Lockup latch: Latch that ensures that early data signals do not arrive at the destination until after the trailing edge of the clock.

As mentioned earlier, the invention provides methods and apparatuses for automatically determining how best to resolve short path violations of varying magnitude and/or to reduce a circuit's sensitivity to negative skew. For example, consider the exemplary circuit elements illustrated in FIG. 1. Here, a clock signal (Clk) is distributed to two legs of the circuit. In one leg, the clock signal is delayed by a first amount ($\delta_{Clk\_S}$) 101 before being supplied to each of three 1-bit source registers 103, 105, 107. In the second leg of the circuit, the clock signal is delayed by a second amount ($\delta_{Clk\_D}$) 109 before being supplied to a 1-bit destination register 111. In this example, the first delay amount 101 differs from the second delay amount 109 sufficiently that a problematic clock skew arises between the two legs of the circuit. That is, the data supplied by the three source registers 103, 105, 107 propagates through intervening logic elements 113, 115, 117, 119 and, despite the propagation delay through the intervening logic elements 113, 115, 117, 119, arrives at the input to the destination register 111 too early to be accurately sampled and stored in the destination register 111. (Or put another way, the negative clock skew causes the destination register 111 to attempt to sample the output of the intervening logic elements 113, 115, 117, 119 too late to store a valid value.)

Figure 2:
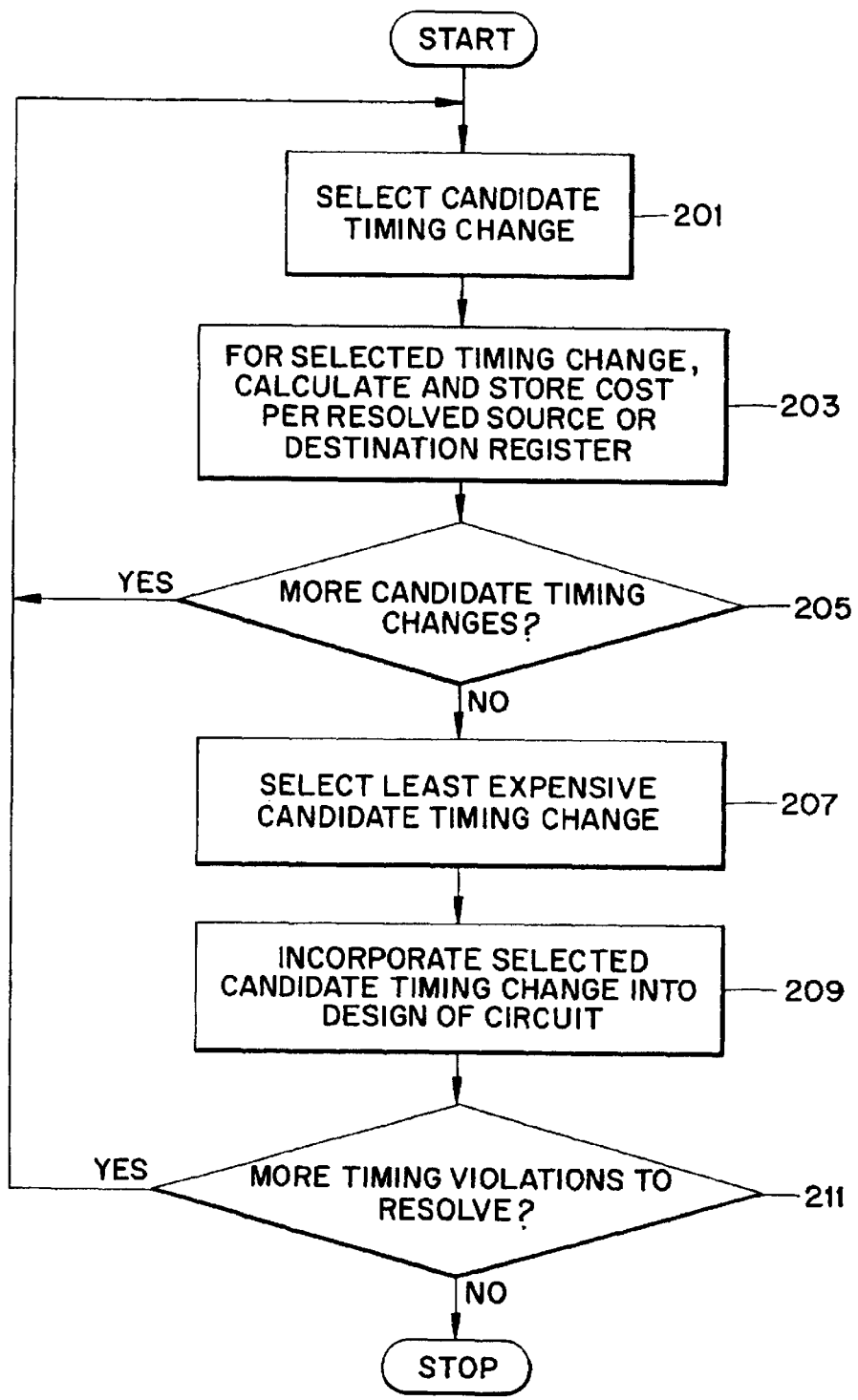
FIG. 2 is a flow chart depicting steps to be performed in accordance with an exemplary embodiment of the invention.

In order to solve this problem, an exemplary embodiment of the invention carries out the steps depicted in the flow chart of FIG. 2. In preferred embodiments, these steps are implemented in an automated processing device, such as an Electronic Design Automation (EDA) tool of the type that electronic circuit designers use to assist them with the design of electronic circuitry. An EDA typically takes the form of a programmable processing device that executes a suitable set of program instructions that perform circuit design functions based on data supplied by an input device. The results of the this processing are presented to the designer by means of an output device, such as a computer screen or storage device. The input/output devices are preferably of a type that provides a suitable Man-Machine Interface (MMI) for a circuit designer (e.g., the output might be in the form of a circuit diagram image displayed on a computer monitor, and the input device may include a pointing device that allows the designer to quickly and accurately point to and select parts of the circuit to be worked on).

Referring now to FIG. 2, the process starts by selecting a candidate timing change from among a number of possible candidate timing changes, each of which would address the timing problem (step 201).

Figure 3:
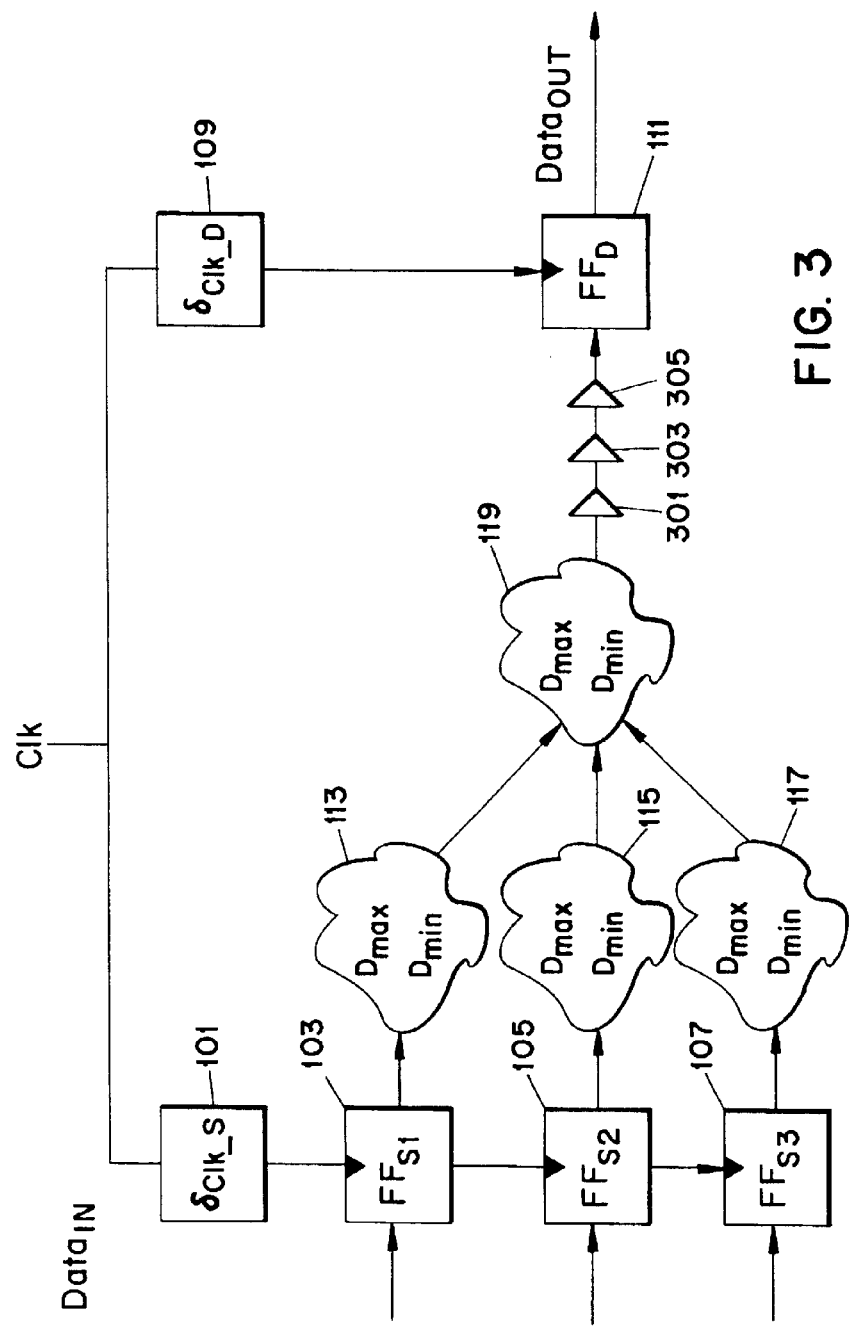
FIG. 3 is a block diagram of a circuit that incorporates one type of candidate timing change that involves adding one or more cascaded buffers at the input of a register that ends a short path.

For example, one candidate timing change might involve adding cascaded buffers at the input of the register that ends a short path. This type of candidate timing change is depicted in FIG. 3, in which three cascaded buffers 301, 303, 305 have been interposed between the output of the logic elements 119 and the input of the destination register 111 in order to address the exemplary timing problem presented by the circuit shown in FIG. 1.

Figure 4:
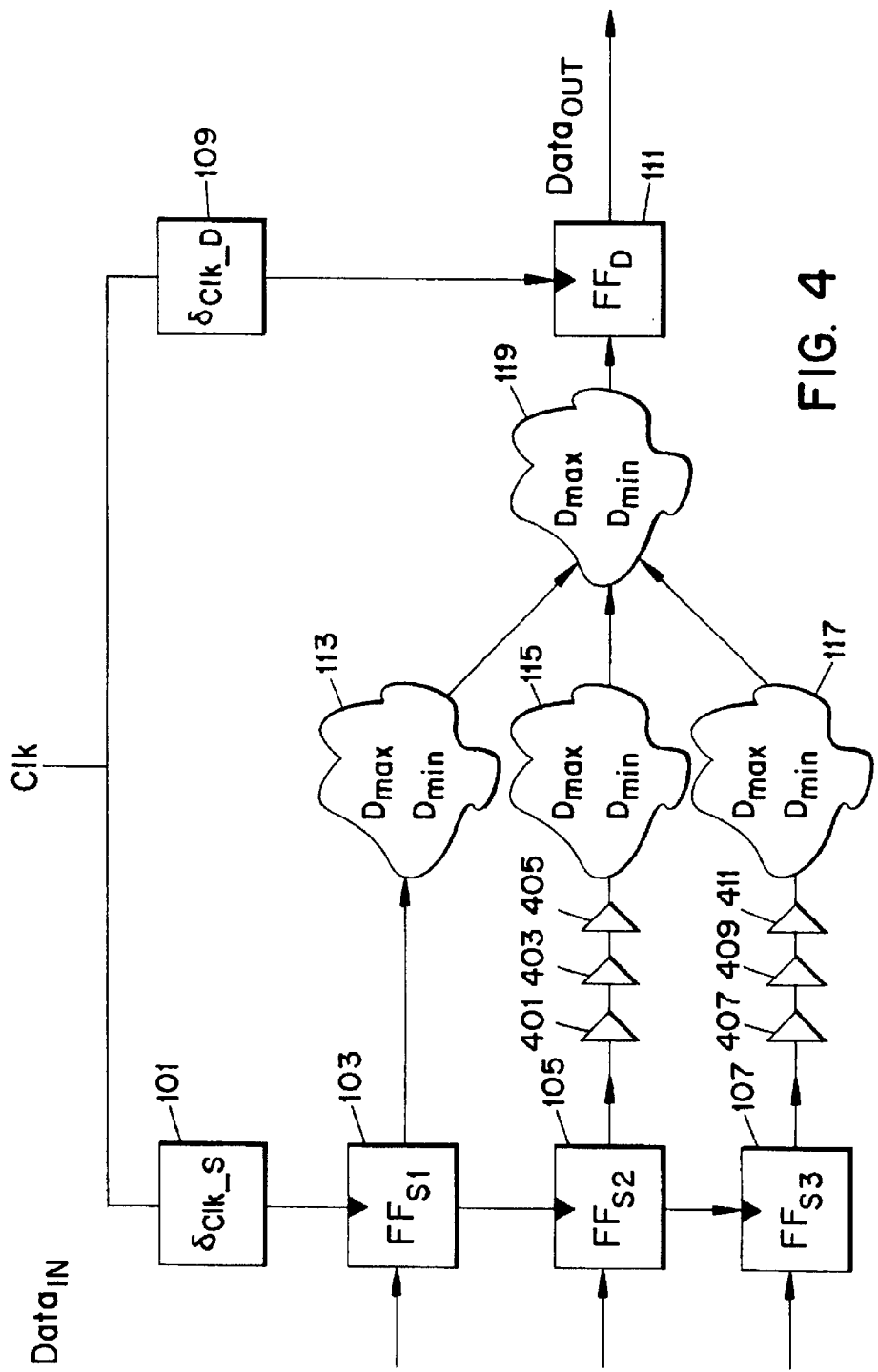
FIG. 4 is a block diagram of a circuit that incorporates one type of candidate timing change that involves adding one or more cascaded buffers between a source register and logic elements associated with a short path.

If adding cascaded buffers at the input of the register that ends a short path will violate any maximum delay requirements (i.e., clock frequency requirements) imposed on the circuit design, then an alternative candidate timing change might be to add some of the buffers between source registers and logic elements associated with short paths. This type of candidate timing change is depicted in FIG. 4, in which a first set of three cascaded buffers 401, 403, 405 are interposed between the source register 105 and the logic elements 115; and a second set of three cascaded buffers 407, 409, 411 are interposed between the source register 107 and the logic elements 117, all for the purpose of addressing the exemplary timing problem presented by the circuit shown in FIG. 1.

Figure 5:
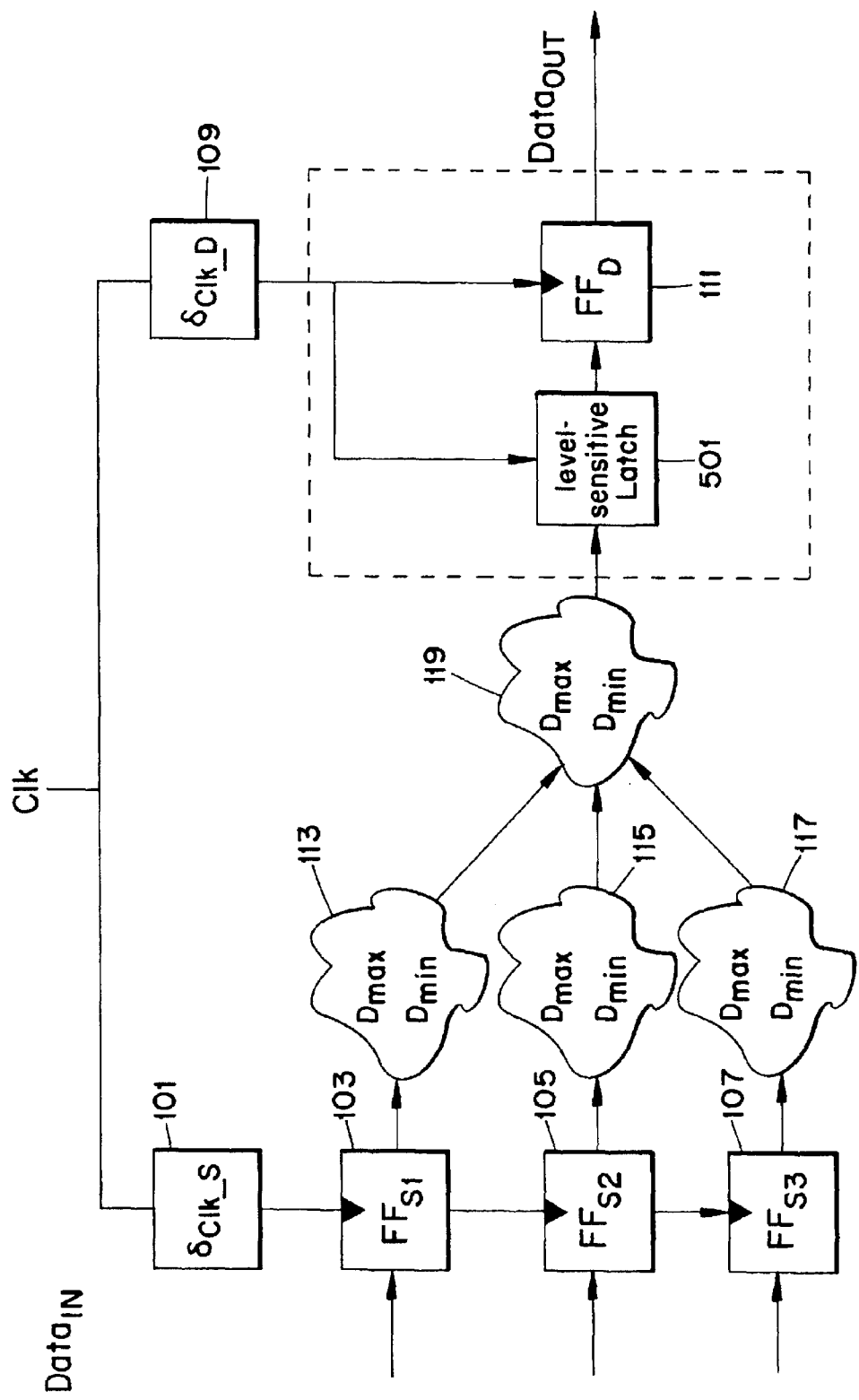
FIG. 5 is a block diagram of a circuit that incorporates one type of candidate timing change that involves adding a lockup latch upstream of a destination register associated with the timing problem.

Yet another possible candidate timing change is to add a lockup latch upstream of the destination register associated with the timing problem. The added lockup latch would be enabled by the destination register's clock. This type of candidate timing change is depicted in FIG. 5, in which a lockup latch 501 has been interposed between the logic elements 119 and the destination register 111, for the purpose of addressing the exemplary timing problem presented by the circuit shown in FIG. 1. The added lockup latch 501 is enabled by the same delayed clock that also clocks the destination register 111. As an alternative to adding a lockup latch upstream of the destination register associated with the timing problem, it is also possible to address the timing problem by replacing the involved destination register (e.g., the destination register 111) by a register that samples on a trailing edge and outputs on a leading edge of the clock. This can be beneficial from a silicon area point of view. In the event that latches are prohibited or otherwise unavailable for use in a design, an alternative is to instead use a trailing edge-triggered register (flip-flop). This alternative does have a somewhat larger area cost, however.

Figure 6:
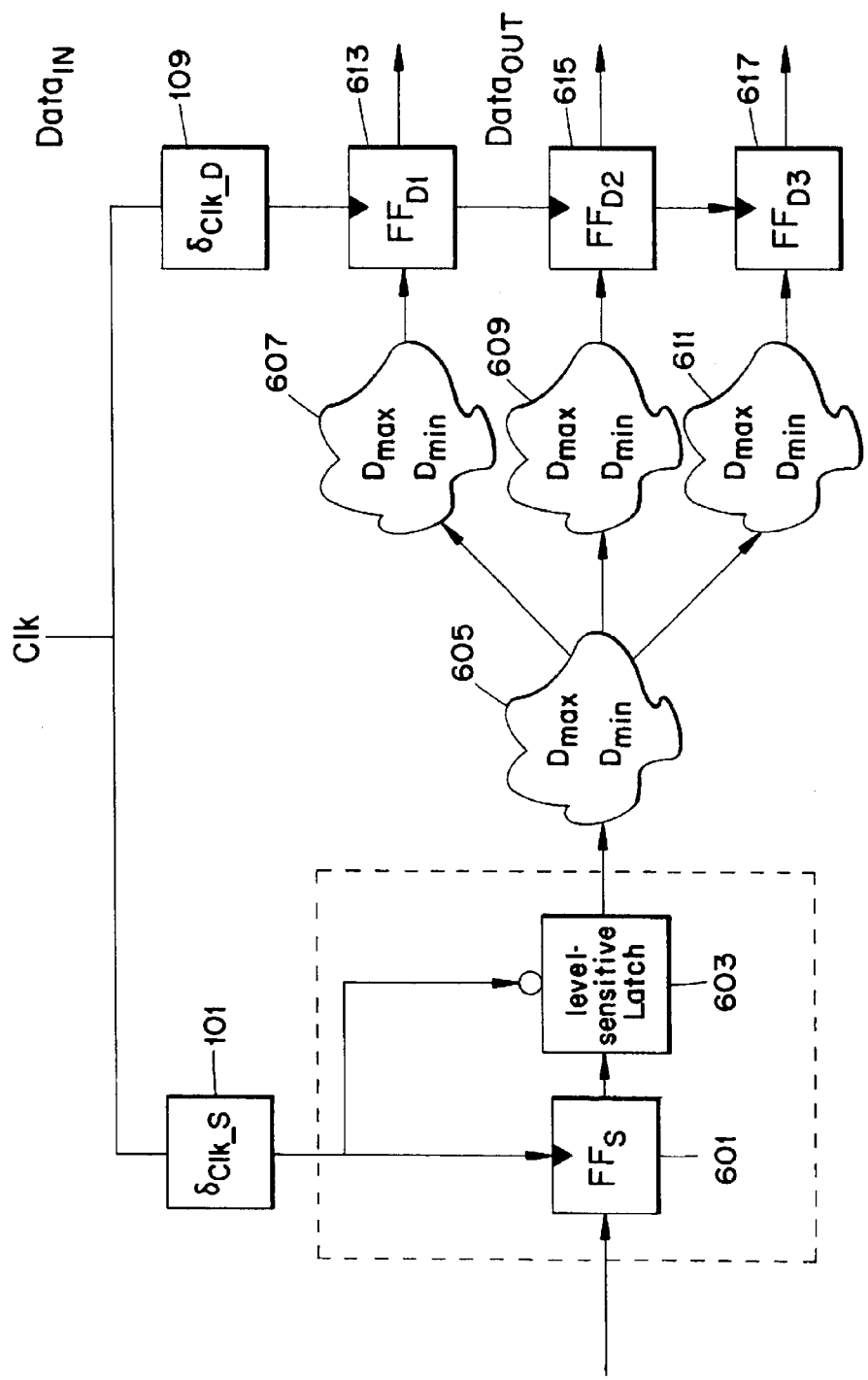
FIG. 6 is a block diagram of a circuit that incorporates one type of candidate timing change that involves adding a lockup latch downstream of a source register that feeds a short path.

Yet another possible candidate timing change is to add a lockup latch downstream of a source register that supplies a signal to one or more short paths. This type of candidate timing change is depicted in FIG. 6, in which a lockup latch has been interposed between the output of a source register 601 and the input of logic elements 605. This exemplary timing change is intended to address a timing problem between the source register 601 and destination registers 613, 615, 617, which are variously coupled to receive a signal derived from the output of the source register 601 by means of logic elements 605, 607, 609 and 611, as shown. The added lockup latch 603 is enabled by the same delayed clock that clocks the source register 601. As an alternative to adding a lockup latch downstream of a source register associated with the timing problem, it is also possible to address the timing problem by replacing the involved source register (e.g., the source register 601) by a register that samples on a leading edge and outputs on a trailing edge of the clock. This can be beneficial from a silicon area point of view. In the event that latches are prohibited or otherwise unavailable for use in a design, an alternative is to instead use a trailing edge-triggered register (flip-flop). This alternative does have a somewhat larger area cost, however.

The above-described candidate timing changes are presented merely for the purpose of illustrating the types of changes that may be considered for the purpose of resulting various circuit timing problems. They are not intended to be an exhaustive list of all possible candidate timing changes— to the contrary, those of ordinary skill in the art will recognize that other types of changes are also possible, and that these are intended to be included within the scope of the term "candidate timing changes" as well.

Referring back now to FIG. 2, having selected one of the candidate timing changes for initial consideration, its cost per resolved source or destination register (generally referred to herein as the "per unit cost") is then calculated and stored (step 203). For example, where the selected candidate timing change involves adding cascaded buffers at the input of the register that ends a short path (see e.g., FIG. 3), the total cost of this change is divided by the number of source registers to the short paths that had their violations resolved. Alternatively, a per unit cost may be determined by dividing the total cost of this change by the sum of the number of source and destination registers that had their violations resolved.

Where the selected candidate timing change involves adding cascaded buffers at the output of the source register that feeds the short paths ending at the destination register (see e.g., FIG. 4), the total cost of this change is divided by the number of destination registers that had their violations resolved. Alternatively, a per unit cost may be determined by dividing the total cost of this change by the sum of the number of source and destination registers that had their violations resolved.

Where the selected candidate timing change involves adding a lockup latch upstream of the destination register (see e.g., FIG. 5), the total cost of this change is divided by the number of source registers to the short paths that had their violations resolved by this technique. Alternatively, a per unit cost may be determined by dividing the total cost of this change by the sum of the number of source and destination registers that had their violations resolved. If it is not possible to implement this candidate timing change due to there either not being any register other than an output port, or due to the fact that such a change would violate maximum path requirements (clock-cycle time), then the cost is simply tagged as being infinite. As used herein, the term "tag" means using a suitable representation of the cost such that it cannot be viewed as being less than any other cost.

Where the selected candidate timing change involves adding a lockup latch downstream of the source register (see e.g., FIG. 6), the total cost of this change is divided by the number of destination registers of the short paths that had their timing violations resolved by this technique. Alternatively, a per unit cost may be determined by dividing the total cost of this change by the sum of the number of source and destination registers that had their violations resolved. Where it is not possible to implement this candidate timing change, due either to there not being any register other than an input port, or due to the fact that such a change would violate maximum path requirements (clock-cycle time), then the cost is tagged as being infinite.

Having calculated the "per unit" cost in step 203, the technique then determines whether there are any more candidate timing changes that should be considered from among the various possible candidate timing changes as described above (decision block 205). If there are ("YES" path out of decision block 205), then the process repeats beginning at step 201.

If all of the candidate timing changes to be considered have been analyzed ("NO" path out of decision block 205), then all of the calculated "per unit" costs are compared with one another. The candidate timing change associated with the least expensive "per unit" cost is then selected (step 207). The selected candidate timing change is then incorporated into the design of the circuit (step 209).

Following this step, it is then determined whether there are any more timing violations to resolve (decision block 211). If so ("YES" path out of decision block 211), then the process is repeated for the next timing violation, beginning at step 201. If there are no more timing violations to resolve ("NO" path out of decision block 211), then the process terminates.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, the exemplary embodiment illustrates a very general design that permits an arbitrary number of candidate timing changes to be considered. It will be readily apparent, however, that for applications in which the number and type of candidate timing changes to be analyzed are predetermined, a straight-line design can be implemented that flows from one analysis to the next without having to perform the steps of selecting a candidate timing change (e.g., step 201) and testing to determine whether any more candidate timing changes should be analyzed (e.g., decision block 205).

Figure 7:
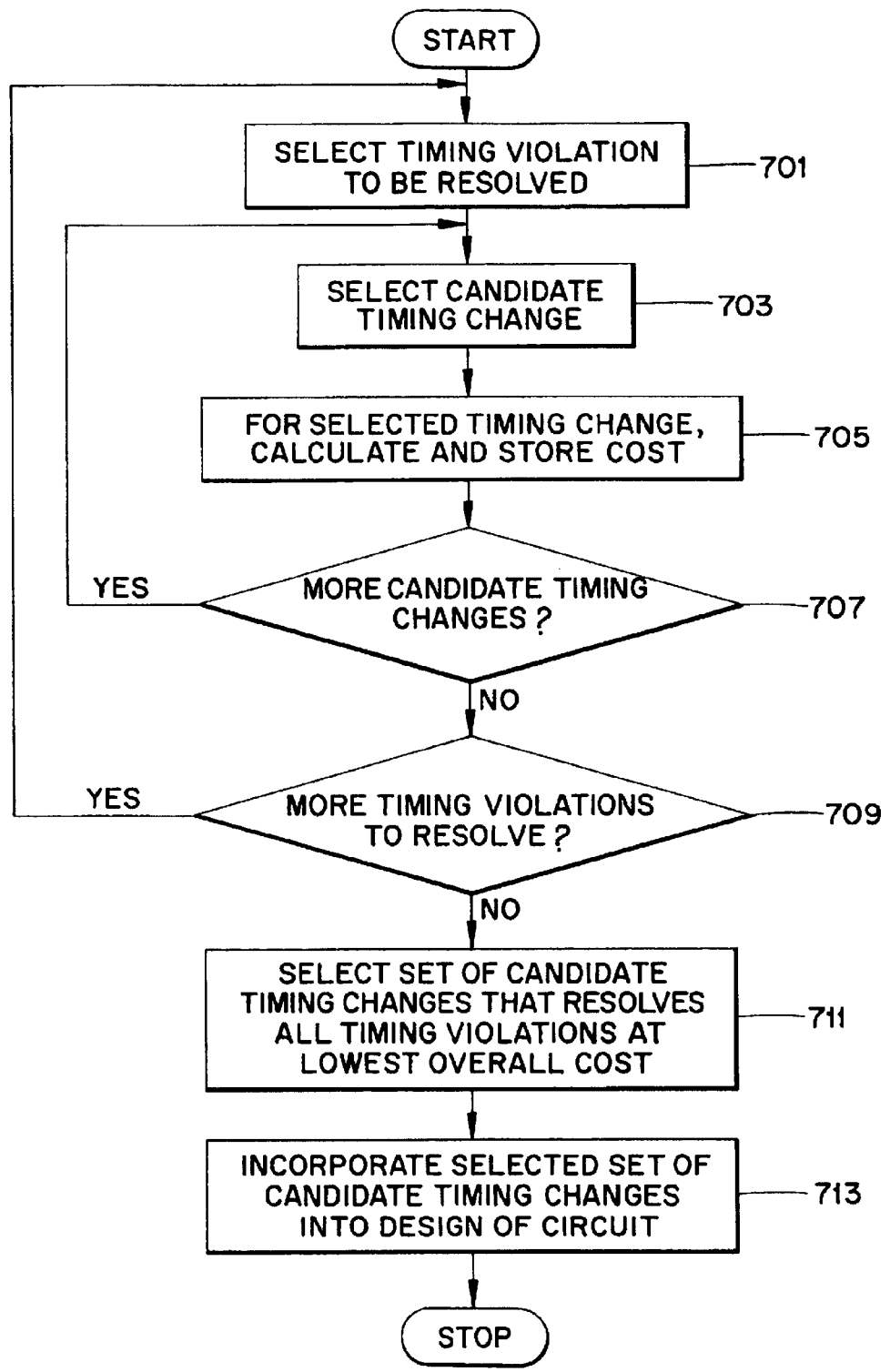
FIG. 7 is a flow chart depicting steps to be performed in accordance with an exemplary alternative embodiment of the invention.

Furthermore, the exemplary embodiment determines timing changes to be incorporated into the design of a circuit based on a per unit cost. However, this is not an essential feature of the invention. For example, in alternative embodiments, a set of timing changes to be incorporated into the design of a circuit can be determined based on total cost values. One such embodiment is illustrated in the flow chart of FIG. 7. First, one of the timing violations is selected for analysis (step 701). Next, a candidate timing change is selected from among a number of possible candidate timing changes that would resolve the selected timing violation (step 703). Candidate timing changes may be of the type described earlier with reference to FIG. 2.

Having selected one of the candidate timing changes for initial consideration, its total (rather than per unit) cost of implementation is calculated and stored (step 705). The technique then determines whether there are any more candidate timing changes that should be considered from among the various possible candidate timing changes as described above (decision block 707). If there are ("YES" path out of decision block 707), then the process repeats for the selected timing violation, beginning at step 703.

If all of the candidate timing changes to be considered for the selected timing violation have been analyzed ("NO" path out of decision block 707), then it is next determined whether there are more timing violations that need to be resolved (decision block 709). If so ("YES" path out of decision block 709), then the process repeats back at step 701, where another timing violation to be analyzed is selected.

If all of the timing violations to be resolved have been analyzed ("NO" path out of decision block 709), then an optimization algorithm is performed that determines which combination of candidate timing changes will resolve all of the timing violations at the lowest overall cost (step 711). It will be observed that for any given timing violation, the selected candidate timing change may not be the least expensive out of the set of candidate timing changes. However, when considered in conjunction with all of the other candidate timing changes selected in accordance with this technique, the overall cost of implementation will be the least expensive. This type of analysis is much more complex than the approach illustrated above with reference to FIG. 2, and therefore requires much more computing time and memory.

Thus, the preferred embodiment is merely illustrative and should not be considered restrictive in anyway. The scope of the invention is given by the appended claims, rather than the preceding description, and all variations and equivalents which fall within the range of the claims are intended to be embraced therein.

What is claimed is:

1. A method of automatically selecting a preferred timing change from a set of candidate timing changes that can be made to address a timing problem in a circuit design, the method comprising:

determining an associated cost metric for each of the candidate timing changes, wherein the associated cost metric is based upon a number of timing problems resolved by the candidate timing change;

identifying a lowest cost metric from the associated cost metrics; and selecting for use as the preferred timing change, from the set of candidate timing changes, the candidate timing change associated with the lowest cost metric.

2. The method of claim 1, wherein the timing problem is associated with signals that are associated with a normal operation of the circuit.

3. The method of claim 1, wherein the associated cost metric represents a cost per resolved source or destination register.

4. The method of claim 1, wherein determining the associated cost metric for one of the candidate timing changes comprises:

determining a total cost of implementing said one of the candidate timing changes;

determining a first number that represents a sum of how many source registers supply a signal to one or more circuit paths whose timing violations would be resolved by said one of the candidate timing changes and how many destination registers receive a signal from one or more circuit paths whose timing violations would be resolved by said one of the candidate timing changes; and generating the associated cost metric for said one of the candidate timing changes by dividing the total cost of implementing said one of the candidate timing changes by the first number.

5. The method of claim 1, wherein:

the circuit design includes one or more short paths, each short path being associated with a short path violation and comprising one or more logic elements that generate a signal to be supplied to a destination register; and the set of candidate timing changes includes a first candidate timing change that involves interposing one or more cascaded buffers between the one or more logic elements and the destination register.

6. The method of claim 5, wherein determining the associated cost metric for the first candidate timing change comprises:

determining a total cost of implementing the first candidate timing change;

determining a first number that represents how many source registers supply a signal to one or more of the one or more short paths whose timing violations would be resolved by the first candidate timing change; and generating the associated cost metric for the first candidate timing change by dividing the total cost of implementing the first candidate timing change by the first number.

7. The method of claim 5, wherein determining the associated cost metric for the first candidate timing change comprises:

determining a total cost of implementing the first candidate timing change;

determining a first number that represents how many destination registers receive a signal from one or more of the one or more short paths whose timing violations would be resolved by the first candidate timing change; and generating the associated cost metric for the first candidate timing change by dividing the total cost of implementing the first candidate timing change by the first number.

8. The method of claim 1, wherein:

the circuit design includes one or more source registers, each of which supplies a signal to one or more short paths that are associated with short path violations; and the set of candidate timing changes includes a first candidate timing change that involves interposing one or more cascaded buffers between one or more of the one or more source registers and one or more of the short paths.

9. The method of claim 8, wherein determining the associated cost metric for the first candidate timing change comprises:

determining a total cost of implementing the first candidate timing change;

determining a first number that represents how many source registers supply a signal to one or more of the one or more short paths whose timing violations would be resolved by the first candidate timing change; and generating the associated cost metric for the first candidate timing change by dividing the total cost of implementing the first candidate timing change by the first number.

10. The method of claim 8, wherein determining the associated cost metric for the first candidate timing change comprises:

determining a total cost of implementing the first candidate timing change;

determining a first number that represents how many destination registers receive a signal from one or more of the one or more short paths whose timing violations would be resolved by the first candidate timing change; and generating the associated cost metric for the first candidate timing change by dividing the total cost of implementing the first candidate timing change by the first number.

11. The method of claim 1, wherein:

the circuit design includes one or more short paths, each short path being associated with a short path violation and comprising one or more logic elements that generate a signal to be supplied to a destination register; and the set of candidate timing changes includes a first candidate timing change that involves interposing a lockup latch between the one or more logic elements and the destination register.

12. The method of claim 11, wherein determining the associated cost metric for the first candidate timing change comprises:

determining a total cost of implementing the first candidate timing change;

determining a first number that represents how many source registers supply a signal to one or more of the one or more short paths whose timing violations would be resolved by the first candidate timing change; and generating the associated cost metric for the first candidate timing change by dividing the total cost of implementing the first candidate timing change by the first number.

13. The method of claim 11, wherein determining the associated cost metric for the first candidate timing change comprises:

tagging the associated cost metric as infinite if it is not possible to implement the first candidate timing change in the circuit design.

14. The method of claim 1, wherein:

the circuit design includes one or more short paths, each short path being associated with a short path violation and comprising one or more logic elements that generate a signal to be supplied to a destination register; and the set of candidate timing changes includes a first candidate timing change that involves interposing a trailing edge-triggered flip-flop between the one or more logic elements and the destination register.

15. The method of claim 14, wherein determining the associated cost metric for the first candidate timing change comprises:

determining a total cost of implementing the first candidate timing change;

determining a first number that represents how many source registers supply a signal to one or more of the one or more short paths whose timing violations would be resolved by the first candidate timing change; and generating the associated cost metric for the first candidate timing change by dividing the total cost of implementing the first candidate timing change by the first number.

16. The method of claim 14, wherein determining the associated cost metric for the first candidate timing change comprises:

tagging the associated cost metric as infinite if it is not possible to implement the first candidate timing change in the circuit design.

17. The method of claim 1, wherein:

the circuit design includes one or more short paths, each short path being associated with a short path violation and comprising one or more logic elements that generate a signal to be supplied to a destination register; and the set of candidate timing changes includes a first candidate timing change that involves replacing the destination register by a register that samples on a trailing edge and outputs on a leading-edge of a clock signal.

18. The method of claim 17, wherein determining the associated cost metric for the first candidate timing change comprises:

determining a total cost of implementing the first candidate timing change;

determining a first number that represents how many source registers supply a signal to one or more of the one or more short paths whose timing violations would be resolved by the first candidate timing change; and generating the associated cost metric for the first candidate timing change by dividing the total cost of implementing the first candidate timing change by the first number.

19. The method of claim 17, wherein determining the associated cost metric for the first candidate timing change comprises:

tagging the associated cost metric as infinite if it is not possible to implement the first candidate timing change in the circuit design.

20. The method of claim 1, wherein:

the circuit design includes one or more source registers, each of which supplies a signal to one or more short paths, wherein each short path is associated with a short path violation; and the set of candidate timing changes includes a first candidate timing change that involves interposing a lockup latch between one or more of the one or more source registers and one or more of the short paths.

21. The method of claim 20, wherein determining the associated cost metric for the first candidate timing change comprises:

determining a total cost of implementing the first candidate timing change;

determining a first number that represents how many destination registers receive a signal from the one or more short paths whose timing violations would be resolved by the first candidate timing change; and generating the associated cost metric for the first candidate timing change by dividing the total cost of implementing the first candidate timing change by the first number.

22. The method of claim 20, wherein determining the associated cost metric for the first candidate timing change comprises:

tagging the associated cost metric as infinite if it is not possible to implement the first candidate timing change in the circuit design.

23. The method of claim 1, wherein:

the circuit design includes one or more source registers, each of which supplies a signal to one or more short paths, wherein each short path is associated with a short path violation; and the set of candidate timing changes includes a first candidate timing change that involves interposing a trailing edge-triggered flip-flop between one or more of the one or more source registers and one or more of the short paths.

24. The method of claim 23, wherein determining the associated cost metric for the first candidate timing change comprises:

determining a total cost of implementing the first candidate timing change;

determining a first number that represents how many destination registers receive a signal from the one or more short paths whose timing violations would be resolved by the first candidate timing change; and generating the associated cost metric for the first candidate timing change by dividing the total cost of implementing the first candidate timing change by the first number.

25. The method of claim 23, wherein determining the associated cost metric for the first candidate timing change comprises:

tagging the associated cost metric as infinite if it is not possible to implement the first candidate timing change in the circuit design.

26. The method of claim 1, wherein:

the circuit design includes one or more source registers, each of which supplies a signal to one or more short paths, wherein each short path is associated with a short path violation; and the set of candidate timing changes includes a first candidate timing change that involves replacing one or more of the one or more source registers by one or more registers that each sample on a leading edge and output on a trailing edge of a clock signal.

27. The method of claim 26, wherein determining the associated cost metric for the first candidate timing change comprises:

determining a total cost of implementing the first candidate timing change;

determining a first number that represents how many destination registers receive a signal from the one or more short paths whose timing violations would be resolved by the first candidate timing change; and generating the associated cost metric for the first candidate timing change by dividing the total cost of implementing the first candidate timing change by the first number.

28. The method of claim 26, wherein determining the associated cost metric for the first candidate timing change comprises:

tagging the associated cost metric as infinite if it is not possible to implement the first candidate timing change in the circuit design.

29. A method of automatically selecting a set of preferred timing changes from a set of candidate timing changes that can be made to address a set of timing problems in a circuit design, the method comprising:

for each of the timing problems, determining an associated cost metric for each of the candidate timing changes;

identifying a least expensive set of candidate timing changes that address the entire set of timing problems and whose combined cost metrics are a lowest combined cost metric;

selecting for use as the set of preferred timing changes, from the set of candidate timing changes, the least expensive set of candidate timing changes.

30. An apparatus that automatically selects a preferred timing change from a set of candidate timing changes that can be made to address a timing problem in a circuit design, the apparatus comprising:

logic that determines an associated cost metric for each of the candidate timing changes, wherein the associated cost metric is based upon a number of timing problems resolved by the candidate timing change;

logic that identifies a lowest cost metric from the associated cost metrics; and logic that selects for use as the preferred timing change, from the set of candidate timing changes, the candidate timing change associated with the lowest cost metric.

31. The apparatus of claim 30, wherein the timing problem is associated with signals that are associated with a normal operation of the circuit.

32. The apparatus of claim 30, wherein the associated cost metric represents a cost per resolved source or destination register.

33. The apparatus of claim 30, wherein the logic that determines the associated cost metric for one of the candidate timing changes comprises:

logic that determines a total cost of implementing said one of the candidate timing changes;

logic that determines a first number that represents a sum of how many source registers supply a signal to one or more circuit paths whose timing violations would be resolved by said one of the candidate timing changes and how many destination registers receive a signal from one or more circuit paths whose timing violations would be resolved by said one of the candidate timing changes; and logic that generates the associated cost metric for said one of the candidate timing changes by dividing the total cost of implementing said one of the candidate timing changes by the first number.

34. The apparatus of claim 30, wherein:

the circuit design includes one or more short paths, each short path being associated with a short path violation and comprising one or more logic elements that generate a signal to be supplied to a destination register; and the set of candidate timing changes includes a first candidate timing change that involves interposing one or more cascaded buffers between the one or more logic elements and the destination register.

35. The apparatus of claim 34, wherein the logic that determines the associated cost metric for the first candidate timing change comprises:

logic that determines a total cost of implementing the first candidate timing change;

logic that determines a first number that represents how many source registers supply a signal to one or more of the one or more short paths whose timing violations would be resolved by the first candidate timing change; and logic that generates the associated cost metric for the first candidate timing change by dividing the total cost of implementing the first candidate timing change by the first number.

36. The apparatus of claim 34, wherein the logic that determines the associated cost metric for the first candidate timing change comprises:

logic that determines a total cost of implementing the first candidate timing change;

logic that determines a first number that represents how many destination registers receive a signal from one or more of the one or more short paths whose timing violations would be resolved by the first candidate timing change; and logic that generates the associated cost metric for the first candidate timing change by dividing the total cost of implementing the first candidate timing change by the first number.

37. The apparatus of claim 30, wherein:

the circuit design includes one or more source registers, each of which supplies a signal to one or more short paths that are associated with short path violations; and the set of candidate timing changes includes a first candidate timing change that involves interposing one or more cascaded buffers between one or more of the one or more source registers and one or more of the short paths.

38. The apparatus of claim 37, wherein the logic that determines the associated cost metric for the first candidate timing change comprises:

logic that determines a total cost of implementing the first candidate timing change;

logic that determines a first number that represents how many source registers supply a signal to one or more of the one or more short paths whose timing violations would be resolved by the first candidate timing change; and logic that generates the associated cost metric for the first candidate timing change by dividing the total cost of implementing the first candidate timing change by the first number.

39. The method of claim 37, wherein the logic that determines the associated cost metric for the first candidate timing change comprises:

logic that determines a total cost of implementing the first candidate timing change;

logic that determines a first number that represents how many destination registers receive a signal from one or more of the one or more short paths whose timing violations would be resolved by the first candidate timing change; and A logic that generates the associated cost metric for the first candidate timing change by dividing the total cost of implementing the first candidate timing change by the first number.

40. The apparatus of claim 30, wherein:

the circuit design includes one or more short paths, each short path being associated with a short path violation and comprising one or more logic elements that generate a signal to be supplied to a destination register; and the set of candidate timing changes includes a first candidate timing change that involves interposing a lockup latch between the one or more logic elements and the destination register.

41. The apparatus of claim 40, wherein the logic that determines the associated cost metric for the first candidate timing change comprises:

logic that determines a total cost of implementing the first candidate timing change;

logic that determines a first number that represents how many source registers supply a signal to one or more of the one or more short paths whose timing violations would be resolved by the first candidate timing change; and logic that generates the associated cost metric for the first candidate timing change by dividing the total cost of implementing the first candidate timing change by the first number.

42. The apparatus of claim 40, wherein the logic that determines the associated cost metric for the first candidate timing change comprises:

logic that tags the associated cost metric as infinite if it is not possible to implement the first candidate timing change in the circuit design.

43. The apparatus of claim 30, wherein:

the circuit design includes one or more short paths, each short path being associated with a short path violation and comprising one or more logic elements that generate a signal to be supplied to a destination register; and the set of candidate timing changes includes a first candidate timing change that involves interposing a trailing edge-triggered flip-flop between the one or more logic elements and the destination register.

44. The apparatus of claim 43, wherein the logic that determines the associated cost metric for the first candidate timing change comprises:

logic that determines a total cost of implementing the first candidate timing change;

logic that determines a first number that represents how many source registers supply a signal to one or more of the one or more short paths whose timing violations would be resolved by the first candidate timing change; and logic that generates the associated cost metric for the first candidate timing change by dividing the total cost of implementing the first candidate timing change by the first number.

45. The apparatus of claim 43, wherein the logic that determines the associated cost metric for the first candidate timing change comprises:

logic that tags the associated cost metric as infinite if it is not possible to implement the first candidate timing change in the circuit design.

46. The apparatus of claim 30, wherein:

the circuit design includes one or more short paths, each short path being associated with a short path violation and comprising one or more logic elements that generate a signal to be supplied to a destination register; and the set of candidate timing changes includes a first candidate timing change that involves replacing the destination register by a register that samples on a trailing edge and outputs on a leading-edge of a clock signal.

47. The apparatus of claim 46, wherein the logic that determines the associated cost metric for the first candidate timing change comprises:

logic that determines a total cost of implementing the first candidate timing change;

logic that determines a first number that represents how many source registers supply a signal to one or more of the one or more short paths whose timing violations would be resolved by the first candidate timing change; and logic that generates the associated cost metric for the first candidate timing change by dividing the total cost of implementing the first candidate timing change by the first number.

48. The apparatus of claim 46, wherein the logic that determines the associated cost metric for the first candidate timing change comprises:

logic that tags the associated cost metric as infinite if it is not possible to implement the first candidate timing change in the circuit design.

49. The apparatus of claim 30, wherein:

the circuit design includes one or more source registers, each of which supplies a signal to one or more short paths, wherein each short path is associated with a short path violation; and the set of candidate timing changes includes a first candidate timing change that involves interposing a lockup latch between one or more of the one or more source registers and one or more of the short paths.

50. The apparatus of claim 49, wherein the logic that determines the associated cost metric for the first candidate timing change comprises:

logic that determines a total cost of implementing the first candidate timing change;

logic that determines a first number that represents how many destination registers receive a signal from the one or more short paths whose timing violations would be resolved by the first candidate timing change; and logic that generates the associated cost metric for the first candidate timing change by dividing the total cost of implementing the first candidate timing change by the first number.

51. The apparatus of claim 49, wherein the logic that determines the associated cost metric for the first candidate timing change comprises:

logic that tags the associated cost metric as infinite if it is not possible to implement the first candidate timing change in the circuit design.

52. The apparatus of claim 30, wherein:

the circuit design includes one or more source registers, each of which supplies a signal to one or more short paths, wherein each short path is associated with a short path violation; and the set of candidate timing changes includes a first candidate timing change that involves interposing a trailing edge-triggered flip-flop between one or more of the one or more source registers and one or more of the short paths.

53. The apparatus of claim 52, wherein the logic that determines the associated cost metric for the first candidate timing change comprises:

logic that determines a total cost of implementing the first candidate timing change;

logic that determines a first number that represents how many destination registers receive a signal from the one or more short paths whose timing violations would be resolved by the first candidate timing change; and logic that generates the associated cost metric for the first candidate timing change by dividing the total cost of implementing the first candidate timing change by the first number.

54. The apparatus of claim 52, wherein the logic that determines the associated cost metric for the first candidate timing change comprises:

logic that tags the associated cost metric as infinite if it is not possible to implement the first candidate timing change in the circuit design.

55. The apparatus of claim 30, wherein:

the circuit design includes one or more source registers, each of which supplies a signal to one or more short paths, wherein each short path is associated with a short path violation; and the set of candidate timing changes includes a first candidate timing change that involves replacing one or more of the one or more source registers by one or more registers that each sample on a leading trailing edge and output on a trailing edge of a clock signal.

56. The apparatus of claim 55, wherein the logic that determines the associated cost metric for the first candidate timing change comprises:

logic that determines a total cost of implementing the first candidate timing change;

logic that determines a first number that represents how many destination registers receive a signal from the one or more short paths whose timing violations would be resolved by the first candidate timing change; and logic that generates the associated cost metric for the first candidate timing change by dividing the total cost of implementing the first candidate timing change by the first number.

57. The apparatus of claim 55, wherein the logic that determines the associated cost metric for the first candidate timing change comprises:

logic that tags the associated cost metric as infinite if it is not possible to implement the first candidate timing change in the circuit design.

58. An apparatus that automatically selects a set of preferred timing changes from a set of candidate timing changes that can be made to address a set of timing problems in a circuit design, the apparatus comprising:

logic that determines, for each of the timing problems, an associated cost metric for each of the candidate timing changes;

logic that identifies a least expensive set of candidate timing changes that address the entire set of timing problems and whose combined cost metrics are a lowest combined cost metric; and logic that selects for use as the set of preferred timing changes, from the set of candidate timing changes, the least expensive set of candidate timing changes.

* * * * *